US009499701B2

(12) United States Patent
Breton et al.

(10) Patent No.: US 9,499,701 B2
(45) Date of Patent: Nov. 22, 2016

(54) WATER-DILUTABLE INKS AND WATER-DILUTED RADIATION CURABLE INKS USEFUL FOR INK-BASED DIGITAL PRINTING (71) Applicant: XEROX CORPORATION, Norwalk, CT (US)

(72) Inventors: Marcel Breton, Mississauga (CA); Carolyn Moorlag, Mississauga (CA); C. Geoffrey Allen, Mississauga (CA); Jenny Eliyahu, Maple (CA)

(73) Assignee: XEROX CORPORATION, Norwalk, CT (US)

(*) Notice: Subject to any disclaimer, the term of this patent is extended or adjusted under 35 U.S.C. 154(b) by 193 days.

(21) Appl. No.: 13/897,300

(22) Filed: May 17, 2013

(65) Prior Publication Data
US 2014/0340455 A1 Nov. 20, 2014

(51) Int. Cl.
*B41J 2/01* (2006.01)
*B41J 2/21* (2006.01)
*C09D 11/02* (2014.01)
*G03F 7/00* (2006.01)
*C09D 11/037* (2014.01)
*C09D 11/101* (2014.01)
*G03F 7/027* (2006.01)

(52) U.S. Cl.
CPC .............. *C09D 11/02* (2013.01); *B41J 2/2107* (2013.01); *C09D 11/037* (2013.01); *C09D 11/101* (2013.01); *G03F 7/00* (2013.01); *G03F 7/027* (2013.01)

(58) Field of Classification Search
CPC .......... B41J 2/01; B41J 2/211; B41J 2/1433; B41J 2/17; B41J 2/17593; B41J 2/2107; B41J 2/1755; B41J 2/2114; B41J 11/0015; B41J 11/002; B41J 2/2056; B41J 2/21; B41J 2/0057; B41J 3/60; C09D 11/36; C09D 11/40; C09D 11/30; C09D 11/38; C09D 11/322; C09D 11/328; C09D 11/101; C09D 11/005; C09D 11/54; C09D 11/52; B41M 5/0011; B41M 5/0017; B41M 7/00; B41M 7/0072; B41M 5/52; B41M 5/5218
USPC .............. 347/100, 95, 96, 101, 102, 21, 20; 523/160, 161; 106/31.6, 31.13, 31.27
See application file for complete search history.

(56) References Cited

U.S. PATENT DOCUMENTS

| | | | |
|---|---|---|---|
| 3,945,957 A | 3/1976 | Noshiro et al. | |
| 4,304,601 A | 12/1981 | Sharp | |
| 4,403,550 A | 9/1983 | Sharp | |
| 4,445,432 A | 5/1984 | Ford, Jr. et al. | |
| 4,806,391 A | 2/1989 | Shorin | |
| 4,911,999 A | 3/1990 | Legere | |
| 4,927,180 A | 5/1990 | Trundle et al. | |
| 5,085,698 A | 2/1992 | Ma et al. | |
| 5,502,476 A | 3/1996 | Neal et al. | |
| 5,834,118 A | 11/1998 | Ranby et al. | |
| 5,886,067 A | 3/1999 | Li et al. | |
| 6,114,489 A | 9/2000 | Vicari et al. | |
| 6,329,446 B1 | 12/2001 | Sacripante et al. | |
| 6,348,561 B1 | 2/2002 | Mychajlowskij et al. | |
| 6,664,015 B1 | 12/2003 | Sacripante | |
| 6,896,937 B2 | 5/2005 | Woudenberg | |
| 7,022,752 B2 | 4/2006 | Hayashi et al. | |
| 7,151,153 B2 | 12/2006 | Bruchmann et al. | |
| 7,202,006 B2 | 4/2007 | Chopra et al. | |
| 7,322,688 B2 | 1/2008 | Woudenberg | |
| 7,538,070 B2 | 5/2009 | Iftime et al. | |
| 7,556,844 B2 | 7/2009 | Iftime et al. | |
| 7,674,326 B2 | 3/2010 | Iftime et al. | |
| 7,708,396 B2 | 5/2010 | Iftime et al. | |
| 7,718,325 B2 | 5/2010 | Norsten et al. | |
| 7,909,924 B2 | 3/2011 | Krishnan et al. | |
| 7,964,271 B2 | 6/2011 | Norsten et al. | |
| 8,001,889 B2 | 8/2011 | Gaugenrieder et al. | |
| 8,124,791 B2 | 2/2012 | Shinjo et al. | |
| 8,158,693 B2 | 4/2012 | Breton et al. | |

(Continued)

FOREIGN PATENT DOCUMENTS

| | | |
|---|---|---|
| JP | 03069954 A | 3/1991 |
| JP | 2011208019 A | 10/2011 |
| WO | 2013119539 A1 | 8/2013 |

OTHER PUBLICATIONS

Allen, et al., "Acrylate Ink Compositions for Ink-Based Digital Lithographic Printing", U.S. Appl. No. 14/610,437, filed Jan. 30, 2015.
Birau, et al., "White Ink Composition for Ink-Based Digital Printing", U.S. Appl. No. 14/619,820, filed Feb. 11, 2015.
Moorlag, et al., "Hyperbranched Ink Compositions for Controlled Dimensional Change and Low Energy Curing", U.S. Appl. No. 14/620,945, filed Feb. 12, 2015.
Breton, et al., "Process Black Ink Compositions and Uses Thereof", U.S. Appl. No. 14/635,679, filed Mar. 2, 2015.
Leach, et al., "The Printing Ink Manual, 5th Edition", Blue Print, New York, pp. 84-86, 516, 525, 544-550, 724-726 (1993).

(Continued)

*Primary Examiner* — Manish S Shah
(74) *Attorney, Agent, or Firm* — MH2 Technology Law Group LLP (57) ABSTRACT

An ink composition useful for digital offset printing applications includes a colorant and a radiation-curable water-dilutable compound. A process for variable data lithographic printing includes applying a dampening fluid to an imaging member surface; forming a latent image by evaporating the dampening fluid from selective locations on the imaging member surface to form hydrophobic non-image areas and hydrophilic image areas; developing the latent image by applying an ink composition including an ink component to the hydrophilic image areas, the ink composition having a radiation-curable water-dilutable compound, a colorant component, and water; and transferring the developed latent image to a receiving substrate, wherein the ink transfer efficiency is 90% or higher.

22 Claims, 1 Drawing Sheet

(56) References Cited

U.S. PATENT DOCUMENTS

| | | |
|---|---|---|
| 3,222,313 A1 | 7/2012 | Iftime et al. |
| 8,771,787 B2 | 7/2014 | Breton et al. |
| 8,895,400 B2 | 11/2014 | Seo et al. |
| 2002/0040073 A1 | 4/2002 | Stone et al. |
| 2002/0107303 A1 | 8/2002 | Miyabashi et al. |
| 2003/0003323 A1 | 1/2003 | Murakami |
| 2003/0044691 A1 | 3/2003 | Setthachayanon et al. |
| 2003/0149130 A1 | 8/2003 | Kondo |
| 2004/0063809 A1 | 4/2004 | Fu et al. |
| 2004/0132862 A1 | 7/2004 | Woudenberg |
| 2004/0233465 A1 | 11/2004 | Coyle |
| 2006/0054040 A1 | 3/2006 | Daems et al. |
| 2007/0166479 A1 | 7/2007 | Drake et al. |
| 2007/0259986 A1 | 11/2007 | Elwakil et al. |
| 2008/0139743 A1 | 6/2008 | Krishnan et al. |
| 2008/0241485 A1 | 10/2008 | Shimohara et al. |
| 2008/0258345 A1 | 10/2008 | Bens et al. |
| 2008/0317957 A1* | 12/2008 | Overbeek et al. .......... 427/256 |
| 2009/0038506 A1 | 2/2009 | Odell et al. |
| 2009/0110843 A1 | 4/2009 | Halahmi et al. |
| 2009/0135239 A1* | 5/2009 | Chretien et al. .......... 347/102 |
| 2009/0280302 A1* | 11/2009 | Fukumoto et al. ........ 428/195.1 |
| 2010/0020123 A1* | 1/2010 | Hirato .......................... 347/19 |
| 2010/0067056 A1 | 3/2010 | Rich et al. |
| 2010/0239777 A1 | 9/2010 | Nakajimi et al. |
| 2011/0045199 A1 | 2/2011 | Cong |
| 2011/0141187 A1 | 6/2011 | Takabayashi |
| 2011/0188023 A1 | 8/2011 | Rondon et al. |
| 2011/0262711 A1 | 10/2011 | Chopra et al. |
| 2012/0040156 A1 | 2/2012 | Ohashi et al. |
| 2012/0103212 A1 | 5/2012 | Stowe et al. |
| 2012/0103213 A1 | 5/2012 | Stowe et al. |
| 2012/0103218 A1 | 5/2012 | Stowe et al. |
| 2012/0103221 A1 | 5/2012 | Stowe et al. |
| 2013/0050366 A1 | 2/2013 | Sasada et al. |
| 2013/0104756 A1 | 5/2013 | Stowe et al. |
| 2013/0305946 A1 | 11/2013 | Iftime et al. |
| 2013/0305947 A1 | 11/2013 | Iftime et al. |
| 2013/0307913 A1 | 11/2013 | Kawashima et al. |
| 2013/0310479 A1 | 11/2013 | Lee et al. |
| 2013/0310517 A1 | 11/2013 | Lee et al. |
| 2013/0324653 A1 | 12/2013 | Bollard et al. |
| 2014/0235752 A1 | 8/2014 | Gharapetian et al. |
| 2014/0333704 A1 | 11/2014 | Takabayashi et al. |
| 2015/0077501 A1 | 3/2015 | Breton et al. |
| 2015/0093690 A1 | 4/2015 | Shimura et al. |
| 2015/0174887 A1 | 6/2015 | Moorlag et al. |
| 2015/0175820 A1 | 6/2015 | Breton et al. |
| 2015/0175821 A1 | 6/2015 | Moorlag et al. |
| 2016/0090490 A1 | 3/2016 | Moorlag et al. |

OTHER PUBLICATIONS

Henri Bouas-Laurent, et al., Organic Photochromism (IUPAC Technical Report), Pure Appl. Chem., vol. 73, No. 4, pp. 639-665, 2001.
Communication dated May 4, 2015, issued in EP Appl. No. 14196839.6, pp. 1-5.
Allen, et al., "Acrylate Ink Compositions for Ink-Based Digital Lithographic Printing", U.S. Appl. No. 14/573,913, filed Dec. 17, 2014.
Allen, et al., "Acrylate Ink Compositions for Ink-Based Digital Lithographic Printing", U.S. Appl. No. 14/645,153, filed Mar. 11, 2015.
Lee, et al., "Methods for Manufacturing Curable Inks for Digital Offset Printing Applications and the Inks Made Therefrom", U.S. Appl. No. 13/947,959, filed Jul. 22, 2013.
Iftime et al., "Fluorescent Security Enabled Ink for Digital Offset Printing Applications", U.S. Appl. No. 13/473,791, filed May 17, 2012.
Iftime, et al., "Photochromic Security Enabled Ink for Digital Offset Printing Applications", U.S. Appl. No. 13/473,921, filed May 17, 2012.
Moorlag, et al., "Methods for Ink-Based Digital Printing With High Ink Transfer Efficiency", U.S. Appl. No. 14/139,690, filed Dec. 23, 2013.
Breton, et al., "Aqueous Dispersible Polymer Inks", U.S. Appl. No. 14/139,708, filed Dec. 23, 2013.
Moorlag, et al., "Aqueous Dispersible Siloxane-Containing Polymer Inks Useful for Printing", U.S. Appl. No. 14/139,811, filed Dec. 23, 2013.
Breton, et al., "White Ink Composition for Ink-Based Digital Printing", U.S. Appl. No. 14/028,369, filed Sep. 16, 2013.
Moorlag, et al., "Inverse Emulsion Acrylate Ink Compositions for Ink-Based Digital Lithographic Printing", U.S. Appl. No. 14/501,071, filed Sep. 30, 2013.
Lee, et al., "Methods for Manufacturing Curable Inks for Digital Offset Printing Applications and the Inks Made Therefrom ", U.S. Appl. No. 13/474,185, filed May 17, 2012.
Thesis of Enrique Michel-Sanchez, Impact of Particle Morphology on the Rheology of PCC-Based Coatings, Aug. 2005.

\* cited by examiner

RELATED ART

WATER-DILUTABLE INKS AND WATER-DILUTED RADIATION CURABLE INKS USEFUL FOR INK-BASED DIGITAL PRINTING

FIELD OF DISCLOSURE

The disclosure relates to inks for ink-based digital printing. In particular, the disclosure relates to water-dilutable and water-diluted digital offset inks suitable for ink-based digital printing using a printing system having a re-imageable imaging member.

BACKGROUND

Conventional lithographic printing techniques cannot accommodate true high-speed variable data printing processes in which images to be printed change from impression to impression, for example, as enabled by digital printing systems. The lithography process is often relied upon, however, because it provides very high quality printing due to the quality and color gamut of the inks used. Lithographic inks are also less expensive than other inks, toners, and many other types of printing or marking materials.

Ink-based digital printing uses a variable data lithography printing system, or digital offset printing system. A "variable data lithography system" is a system that is configured for lithographic printing using lithographic inks and based on digital image data, which may be variable from one image to the next. "Variable data lithography printing," or "digital ink-based printing," or "digital offset printing" is lithographic printing of variable image data for producing images on a substrate that are changeable with each subsequent rendering of an image on the substrate in an image forming process.

For example, a digital offset printing process may include transferring radiation-curable ink onto a portion of a fluorosilicone-containing imaging member or printing plate that has been selectively coated with a dampening fluid layer according to variable image data. The ink is then transferred from the printing plate to a substrate such as paper, plastic, or metal on which an image is being printed and cured. The same portion of the imaging plate may be optionally cleaned depending on ink type and used to make a succeeding image that is different than the preceding image, based on the variable image data.

Digital offset printing inks differ from conventional inks because they must meet demanding rheological requirements imposed by the lithographic printing process while being compatible with system component materials and meeting the functional requirements of sub-system components, including wetting and transfer.

SUMMARY

Digital offset inks are provided that are radiation curable, compatible with ink-based digital printing system components, and have high transfer efficiency, which reduces ghosting of previously printed images if a cleaning system is not used. Digital offset inks contain much higher (up to 10 times, for example, or 10% to 50% by weight of the total weight of the ink composition) pigment loading, and therefore have higher viscosity at room temperature and the temperature of application during a printing process. Methods for manufacturing digital offset inks having high pigment loading and, optionally, high viscosities have been provided. For example, U.S. patent application Ser. No. 13/474,185, titled "Methods For Manufacturing Curable Inks For Digital Offset Printing Applications And The Inks Made Therefrom," filed on May 17, 2012, by Lee et al., the disclosure of which is hereby incorporated by reference herein in its entirety, discloses UV curable ink compositions and methods for the manufacture thereof that do not gel, contain a high pigment load, and can have a high viscosity that is advantageous for digital offset printing.

Related art inks including traditional offset inks can present the following challenges: solubility in the dampening fluid, swelling of the silicone layer on the imaging member, poor release properties from the imaging member, and limited curing performance. Digital offset inks must be compatible with a surface layer of the imaging member. For example, the ink composition should not swell and deform the silicone, fluorosilicone, and/or VITON-containing imaging member surface layer, thereby causing image quality defects. The digital offset ink should also be formulated for adhering to portions of the imaging member surface. For example, such surface layer portions include those from which dampening fluid has been removed during a lithographic printing process, after laser patterning of a dampening fluid layer applied to the imaging member surface layer.

Further, digital offset ink must be compatible with dampening fluids such as octamethylcyclotetrasiloxane (D4) and cyclopentasiloxane (D5), and not mixing with the dampening fluid thereby affecting background areas, or portions of the imaging member surface from which dampening fluid has not been removed after laser patterning.

Digital offset ink compositions have been provided that have certain wetting and release properties that are useful with the re-imageable imaging member of digital offset systems, and that are also compatible with non-aqueous dampening fluids. For example, U.S. application Ser. No. 13/474,138, titled "Inks For Offset Digital Printing Applications," filed on May 17, 2012, by Breton et al., the disclosure of which is incorporated herein by reference in its entirety, discloses ink compositions having desired solubility parameters that are compatible with dampening fluids.

Other ink compositions suitable for ink-based digital printing have been developed. For example, U.S. application Ser. No. 13/473,791, titled "Fluorescent Security Enabled Ink For Digital Offset Printing Applications," filed on May 17, 2012, by Iftime et al., the disclosure of which is incorporated herein by reference in its entirety, discloses an ink composition useful for digital offset printing applications comprises a fluorescent colorant and a plurality of curable compounds. The compounds have desirable Hansen solubility parameters are as described herein, and the ink composition is both compatible with certain dampening fluids and has certain rheological properties, including a low viscosity. The fluorescent ink composition is useful for printing security features at high speed in short runs with customized data to produce anti-counterfeit packaging.

Also, U.S. application Ser. No. 13/473,791, titled "Photochromic Security Enabled Ink for Digital Offset Printing Applications," filed on May 17, 2012, by Iftime et al., the disclosure of which is incorporated herein by reference in its entirety, discloses certain photochromic ink compositions which are compatible with dampening fluids and are useful for providing security information in variable data lithographic printing applications.

New radiation curable ink designs for digital offset inks are desired, however, for enhanced ink-based digital printing. It has been found that available inks for ink-based digital printing suffer from shortfalls relating to solubility with dampening fluid, image background issues, high cost requirements, a narrow design space. Improved inks are provided that meet wetting and release requirements while being compatible with non-aqueous dampening fluid, and tending not to swell a silicone-containing imaging member surface are provided. Moreover, inks are provided that enable highly efficient ink transfer from an ink delivery system such as an anilox roll during a printing process while avoiding image quality defects in a resulting printed image.

In particular, inks in accordance with some embodiments are homogenous, polar, and water-dilutable while having a rheology that is appropriate for ink-based digital printing. "Water dilutable" inks are inks to which water may be added in an amount of 40% or lower without causing phase separation. Also provided are water-diluted inks in accordance with other embodiments, which are suitable for anilox roll delivery by way of low content, e.g., about 1% to about 20%, water dilution. Water evaporation may be used to produce excellent transferability of water-diluted ink from a surface of an imaging member after deliver to the imaging member surface form an anilox roll. Water-diluted compositions may be formed using the water-dilutable compositions of embodiments.

In an embodiment, ink compositions for variable data lithographic printing may include a radiation-curable water-dilutable compound, and a colorant component. The ink composition may include water-dilutable monomer compounds selected from the group of compounds comprising mono-, di-, and tri-functional water-dilutable acrylate monomers and oligomers. In an embodiment, the radiation-curable water-dilutable compound comprises functional acrylate compounds. The radiation-curable water-dilutable monomer compounds may be multi-functional acrylate compounds. The radiation-curable water-dilutable compound may be aromatic urethane acrylate in an embodiment.

In an embodiment, the radiation-curable water-dilutable compound may be polyethylene glycol diacrylate. The radiation-curable water-dilutable compound may be polyether triacrylate. The radiation-curable water-dilutable compound may present in an amount of from about 1% to about 85% by weight in an embodiment. The radiation-curable water-dilutable compound may be present in an amount of from about 30% to about 80% by weight. In an embodiment, the radiation-curable water-dilutable compound may be present in an amount of from about 50% to about 70% by weight.

In an embodiment, the colorant may include a pigment, the pigment being present in an amount lying in a range of from about 10% to about 30% by weight. In an embodiment, the colorant may include a pigment, the pigment being present in an amount lying in a range of from about 15% to about 30% by weight. The colorant may include a pigment, the pigment being present in an amount lying in a range of from about 20% to about 25% by weight.

In an embodiment, ink compositions for variable data lithographic printing may include a radiation-curable water-dilutable compound, and at least one component selected from the group of components comprising a colorant component; and water in amount of about 1% to about 10% by weight. The radiation-curable water-dilutable compound may include a water-dilutable monomer compounds selected from the group of compounds comprising mono-, di-, and tri-functional water-dilutable acrylate monomers and oligomers. The colorant may include a pigment, the pigment being present in an amount of from about 10% to about 30% by weight.

In an embodiment, the ink composition may have a viscosity of from about $1 \times 10^4$ to about $1 \times 10^7$ centipoise at 25° C. and a shear rate of from about 1 to about 500 $sec^{-1}$. In an embodiment, the ink composition may include water in an amount of from about 0.01 to about 5% by weight. In an embodiment, the ink composition may include a viscosity of from about $1 \times 10^4$ to about $1 \times 10^7$ centipoise at 25° C. and a shear rate of from about 1 to about 500 $sec^{-1}$, and wherein the viscosity at 5 $sec^{-1}$ after adding the water is from about 1.05 to about 15 times lower than the viscosity of the ink before adding the water.

In an embodiment, methods of using a water-dilutable ink composition for variable data lithographic printing may include applying a dampening fluid to an imaging member surface; forming a latent image by evaporating the dampening fluid from selective locations on the imaging member surface to form hydrophobic non-image areas and hydrophilic image areas; developing the latent image by applying an amount of the water-dilutable ink composition to the hydrophilic image areas, the water-dilutable ink composition comprising a radiation-curable water-dilutable compound, and a colorant component; and transferring the developed latent image to a receiving substrate.

In an embodiment, methods may include the transferring further including removing at least 90% of the amount of the applied water-dilutable ink composition from the imaging member surface. Methods may include, when the water-dilutable ink composition comprises water, the drying the ink on the imaging member surface. Methods may include the forming a latent image further include exposing the locations the imaging member to UV radiation, the exposed locations being selected based on digital image data. In methods, the dampening fluid may include D4, or D5, or mixtures thereof. Methods may include the radiation-curable water-dilutable compound being present in an amount of from about 1% to about 85% by weight.

Exemplary embodiments are described herein. It is envisioned, however, that any system that incorporates features of systems described herein are encompassed by the scope and spirit of the exemplary embodiments.

DETAILED DESCRIPTION

Exemplary embodiments are intended to cover all alternatives, modifications, and equivalents as may be included within the spirit and scope of the apparatus and systems as described herein.

The modifier "about" used in connection with a quantity is inclusive of the stated value and has the meaning dictated by the context (for example, it includes at least the degree of error associated with the measurement of the particular quantity). When used with a specific value, it should also be considered as disclosing that value.

Reference is made to the drawing to accommodate understanding of compositions and systems for ink-based digital printing for inks in accordance with embodiments. In the drawing, like reference numerals are used throughout to designate similar or identical elements.

Water-dilutable and water-diluted inks in accordance with embodiments are suitable both for ink-based digital printing using anilox roll and inkjet ink delivery subsystems, but are also advantageously suitable for inkjet printing generally.

Water-dilutable and water-diluted inks in accordance with embodiments are radiation curable. While inks of embodiments may be formulated to be jettable and used in inkjet systems that employ a heat drying subsystem, for example, an ink-based digital printing system with anilox roll ink delivery subsystem for use with inks of embodiments is described herein by way of example.

Figure 1:
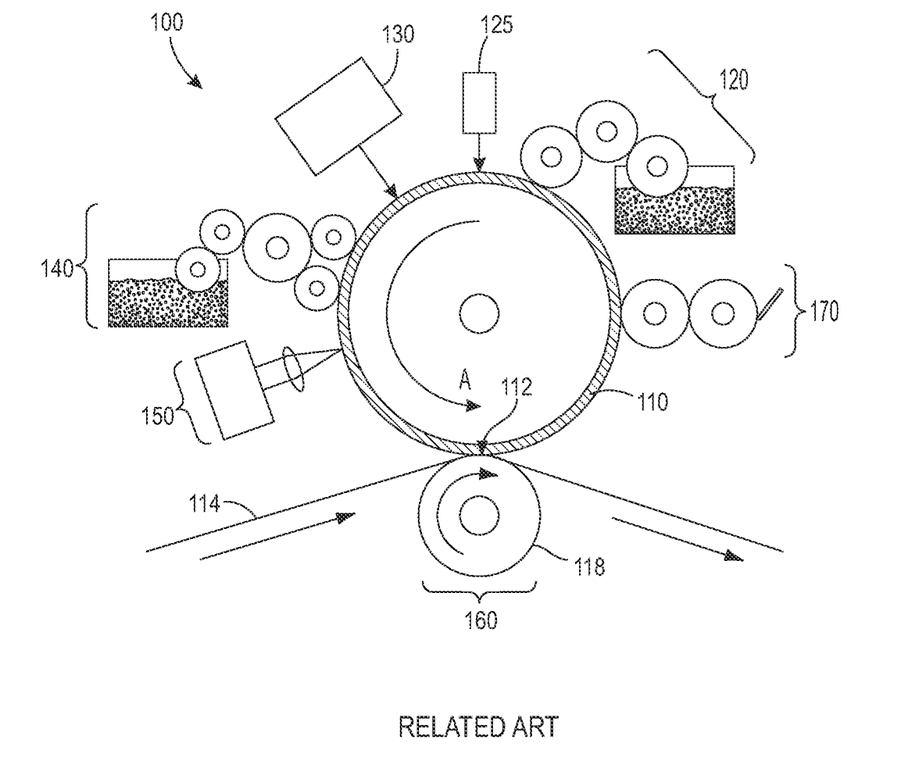
FIG. 1 shows a side diagrammatical view of a related art ink-based digital printing system.

U.S. patent application Ser. No. 13/095,714 ("714 Application"), titled "Variable Data Lithography System," filed on Apr. 27, 2011, by Stowe et al., which is commonly assigned, and the disclosure of which is hereby incorporated by reference herein in its entirety, describes an exemplary variable data lithography system 100 for ink-based digital printing in FIG. 1. A general description of the exemplary system 100 shown in FIG. 1 is provided here. Additional details regarding individual components and/or subsystems shown in the exemplary system 100 of FIG. 1 may be found in the 714 Application.

As shown in FIG. 1, the exemplary system 100 may include an imaging member 110. The imaging member 110 in the embodiment shown in FIG. 1 is a drum, but this exemplary depiction should not be interpreted so as to exclude embodiments wherein the imaging member 110 includes a drum, plate or a belt, or another now known or later developed configuration. The reimageable surface may be formed of materials including, for example, a class of materials commonly referred to as silicones, including polydimethylsiloxane (PDMS), among others. For example, silicone, fluorosilicone, and/or VITON may be used. The reimageable surface may be formed of a relatively thin layer over a mounting layer, a thickness of the relatively thin layer being selected to balance printing or marking performance, durability and manufacturability.

The imaging member 110 is used to apply an ink image to an image receiving media substrate 114 at a transfer nip 112. The transfer nip 112 is formed by an impression roller 118, as part of an image transfer mechanism 160, exerting pressure in the direction of the imaging member 110. Image receiving medium substrate 114 should not be considered to be limited to any particular composition such as, for example, paper, plastic, or composite sheet film. The exemplary system 100 may be used for producing images on a wide variety of image receiving media substrates. The 714 Application also explains the wide latitude of marking (printing) materials that may be used, including marking materials with pigment loading greater than 10% by weight. As does the 714 Application, this disclosure will use the term ink to refer to a broad range of printing or marking materials to include those which are commonly understood to be inks, pigments, and other materials which may be applied by the exemplary system 100 to produce an output image on the image receiving media substrate 114.

The 714 Application depicts and describes details of the imaging member 110 including the imaging member 110 being comprised of a reimageable surface layer formed over a structural mounting layer that may be, for example, a cylindrical core, or one or more structural layers over a cylindrical core.

The exemplary system 100 includes a dampening fluid system 120 generally comprising a series of rollers, which may be considered as dampening rollers or a dampening unit, for uniformly wetting the reimageable surface of the imaging member 110 with dampening fluid. A purpose of the dampening fluid system 120 is to deliver a layer of dampening fluid, generally having a uniform and controlled thickness, to the reimageable surface of the imaging member 110. As indicated above, it is known that a dampening fluid such as fountain solution may comprise mainly water optionally with small amounts of isopropyl alcohol or ethanol added to reduce surface tension as well as to lower evaporation energy necessary to support subsequent laser patterning, as will be described in greater detail below. Small amounts of certain surfactants may be added to the fountain solution as well. Alternatively, other suitable dampening fluids may be used to enhance the performance of ink based digital lithography systems. Exemplary dampening fluids include water, NOVEC™ 7600 (1,1,1,2,3,3-Hexafluoro-4-(1,1,2,3,3,3-hexafluoropropoxy)pentane and has CAS#870778-34-0.), and D4 (octamethylcyclotetrasiloxane). Other suitable dampening fluids are disclosed, by way of example, in co-pending U.S. patent application Ser. No. 13/284,114, filed on Oct. 28, 2011, titled "DAMPENING FLUID FOR DIGITAL LITHOGRAPHIC PRINTING," the disclosure of which is hereby incorporated herein by reference in its entirety.

Once the dampening fluid is metered onto the reimageable surface of the imaging member 110, a thickness of the dampening fluid may be measured using a sensor 125 that may provide feedback to control the metering of the dampening fluid onto the reimageable surface of the imaging member 110 by the dampening fluid system 120.

After a precise and uniform amount of dampening fluid is provided by the dampening fluid system 120 on the reimageable surface of the imaging member 110, and optical patterning subsystem 130 may be used to selectively form a latent image in the uniform dampening fluid layer by imagewise patterning the dampening fluid layer using, for example, laser energy. Typically, the dampening fluid will not absorb the optical energy (IR or visible) efficiently. The reimageable surface of the imaging member 110 should ideally absorb most of the laser energy (visible or invisible such as IR) emitted from the optical patterning subsystem 130 close to the surface to minimize energy wasted in heating the dampening fluid and to minimize lateral spreading of heat in order to maintain a high spatial resolution capability. Alternatively, an appropriate radiation sensitive component may be added to the dampening fluid to aid in the absorption of the incident radiant laser energy. While the optical patterning subsystem 130 is described above as being a laser emitter, it should be understood that a variety of different systems may be used to deliver the optical energy to pattern the dampening fluid.

The mechanics at work in the patterning process undertaken by the optical patterning subsystem 130 of the exemplary system 100 are described in detail with reference to FIG. 5 in the 714 Application. Briefly, the application of optical patterning energy from the optical patterning subsystem 130 results in selective removal of portions of the layer of dampening fluid.

Following patterning of the dampening fluid layer by the optical patterning subsystem 130, the patterned layer over the reimageable surface of the imaging member 110 is presented to an inker subsystem 140. The inker subsystem 140 is used to apply a uniform layer of ink over the layer of dampening fluid and the reimageable surface layer of the imaging member 110. The inker subsystem 140 may use an anilox roller to meter an offset lithographic ink onto one or more ink forming rollers that are in contact with the reimageable surface layer of the imaging member 110. Separately, the inker subsystem 140 may include other traditional elements such as a series of metering rollers to provide a precise feed rate of ink to the reimageable surface. The inker subsystem 140 may deposit the ink to the pockets representing the imaged portions of the reimageable surface, while ink on the unformatted portions of the dampening fluid will not adhere to those portions.

The cohesiveness and viscosity of the ink residing in the reimageable layer of the imaging member 110 may be modified by a number of mechanisms. One such mechanism may involve the use of a rheology (complex viscoelastic modulus) control subsystem 150. The rheology control system 150 may form a partial crosslinking core of the ink on the reimageable surface to, for example, increase ink cohesive strength relative to the reimageable surface layer. Curing mechanisms may include optical or photo curing, heat curing, drying, or various forms of chemical curing. Cooling may be used to modify rheology as well via multiple physical cooling mechanisms, as well as via chemical cooling.

The ink is then transferred from the reimageable surface of the imaging member 110 to a substrate of image receiving medium 114 using a transfer subsystem 160. The transfer occurs as the substrate 114 is passed through a nip 112 between the imaging member 110 and an impression roller 118 such that the ink within the voids of the reimageable surface of the imaging member 110 is brought into physical contact with the substrate 114. With the adhesion of the ink having been modified by the rheology control system 150, modified adhesion of the ink causes the ink to adhere to the substrate 114 and to separate from the reimageable surface of the imaging member 110. Careful control of the temperature and pressure conditions at the transfer nip 112 may allow transfer efficiencies for the ink from the reimageable surface of the imaging member 110 to the substrate 114 to exceed 95%. While it is possible that some dampening fluid may also wet substrate 114, the volume of such a dampening fluid will be minimal, and will rapidly evaporate or be absorbed by the substrate 114.

In certain offset lithographic systems, it should be recognized that an offset roller, not shown in FIG. 1, may first receive the ink image pattern and then transfer the ink image pattern to a substrate according to a known indirect transfer method. Following the transfer of the majority of the ink to the substrate 114, any residual ink and/or residual dampening fluid must be removed from the reimageable surface of the imaging member 110, preferably without scraping or wearing that surface. An air knife may be employed to remove residual dampening fluid. It is anticipated, however, that some amount of ink residue may remain. Removal of such remaining ink residue may be accomplished through use of some form of cleaning subsystem 170. The 714 Application describes details of such a cleaning subsystem 170 including at least a first cleaning member such as a sticky or tacky member in physical contact with the reimageable surface of the imaging member 110, the sticky or tacky member removing residual ink and any remaining small amounts of surfactant compounds from the dampening fluid of the reimageable surface of the imaging member 110. The sticky or tacky member may then be brought into contact with a smooth roller to which residual ink may be transferred from the sticky or tacky member, the ink being subsequently stripped from the smooth roller by, for example, a doctor blade.

The 714 Application details other mechanisms by which cleaning of the reimageable surface of the imaging member 110 may be facilitated. Regardless of the cleaning mechanism, however, cleaning of the residual ink and dampening fluid from the reimageable surface of the imaging member 110 is essential to preventing ghosting in the proposed system. Once cleaned, the reimageable surface of the imaging member 110 is again presented to the dampening fluid system 120 by which a fresh layer of dampening fluid is supplied to the reimageable surface of the imaging member 110, and the process is repeated.

As discussed above, digital offset ink must possess physical and chemical properties that are specific to ink-based digital printing systems. The ink must be compatible with materials that it comes in contact with, including the imaging plate and dampening fluid, and printable substrates such as paper, metal, or plastic. The ink must also meet all functional requirements of the subsystems including wetting and transfer properties defined by subsystem architecture and material sets.

Inks formulated for ink-based digital printing, or digital offset inks, are different in many ways from other inks developed for printing applications, including pigmented solvents, UV gel inks, and other inks. For example, digital offset inks contain much higher pigment and therefore have higher viscosity at room temperature than other inks, which can make ink delivery by way of an anilox roll or inkjet system difficult. Digital offset inks must meet certain wetting and release property requirements imposed by the imaging member used for ink-based digital printing processes, while being compatible with non-aqueous dampening fluid options. Digital offset ink should not cause the imaging member surface to swell. Water-dilutable and water-diluted inks in accordance with embodiments include digital offset acrylate inks meeting such requirements.

Digital offset inks in accordance with water-dilutable ink embodiments advantageously have a much lower solubility in dampening fluid such as D4 than related art inks. Also, digital offset inks of embodiments do not tend to swell a silicone-containing imaging member surface layer used in ink-based digital printing systems such as that shown in FIG. 1, which may be a silicone, fluorosilicone, or VITON-containing imaging plate or blanket.

The inks described herein may include the following components: (a) radiation-curable water-dilutable monomer compounds, including mono-, di-, and tri-functional water-dilutable acrylate monomers, oligomers; (b) dispersants; (c) pigments; (d) clays; (e) initiators; (f) additional curable compounds including monomers, oligomers, including oligomers from Sartomer USA, LLC or Cytec Industries, Inc., prepolymers, polymers; (g) additives including surfactants, free-radical scavengers, and the like.

The water-diluted curable components (a) may include any water-dilutable acrylate or methacrylate monomer compound(s) suitable for use as a phase change ink carrier. In embodiments, the water-diluted curable component is a water-dilutable functional acrylate monomer, a methacrylate monomer, a multifunctional acrylate monomer, a multifunctional methacrylate monomer, or a mixture or combination thereof. In embodiments, a mixture of the components is water-dilutable. One or more components in a mixture may be non-water dilutable, if the ink is water dilutable, and the reactive component are themselves miscible. In the same way that water may be added, in some embodiments, co-reactive monomers may be added to control polarity of the ink. Specific examples of water-dilutable curable components include, but are not limited to, the functional water soluble aromatic urethane acrylate compound (available from CYTEC as EBECRYL 2003), the di-functional compound polyethylene glycol diacrylate (available from CYTEC as EBECRYL 11), and the tri-functional compound polyether triacrylate (available from CYTEC as EBECRYL 12). The monomer or oligomer can be present in any suitable amount. In embodiments, the monomer or oligomer, or combination thereof is added in an amount of from about 10 to about 85%, or from about 30 to about 80%, or from about 50 to about 70%, by weight based on the total weight of the curable ink composition.

The dispersant components (b) may include any suitable or desired dispersant including, but not limited to AB-diblock copolymers of high molecular weight such as EFKA® 4340 available from BASF SE, and DISPERBYK® 2100 available from Byk-Chemie GmbH, or a mixture thereof. In a specific embodiment, the dispersant mixture comprises a cyclohexane dimethanol diacrylate (such as CD406® available from Sartomer USA, LLC) and at least one additional component, such as EFKA® 4340 is a high molecular weight dispersing agent having an AB-diblock copolymer structure available from BASF SE. In an exemplary embodiment, the dispersant is a polymeric dispersant, such as SOLSPERSE® 39000, commercially available from The Lubrizol Corporation. The dispersant may be added in an amount within the range of from about 20% to about 100% by weight, based on the weight of the composition. Dispersant may be added in an amount that is determined based on the amount of pigment used.

The disclosed curable ink composition also includes a colorant or pigment component (c), which may be any desired or effective colorant may be employed, including pigments, mixtures of pigments, mixtures of pigments and dyes, and the like, provided that the colorant may be dissolved or dispersed in the at least one monomer and at least one dispersant. In specific embodiments, the colorant is a pigment. Examples of suitable pigments include PALIOGEN Violet 5100 (BASF); PALIOGEN Violet 5890 (BASF); HELIOGEN Green L8730 (BASF); LITHOL Scarlet D3700 (BASF); SUNFAST. Blue 15:4 (Sun Chemical); Hostaperm Blue B2G-D (Clariant); Permanent Red P-F7RK; HOSTAPERM Violet BL (Clariant); LITHOL Scarlet 4440 (BASF); Bon Red C (Dominion Color Company); ORACET Pink RF (Ciba); PALIOGEN Red 3871 K (BASF); SUNFAST Blue 15:3 (Sun Chemical); PALIOGEN Red 3340 (BASF); SUNFAST Carbazole Violet 23 (Sun Chemical); LITHOL Fast Scarlet L4300 (BASF); SUNBRITE Yellow 17 (Sun Chemical); HELIOGEN Blue L6900, L7020 (BASF); SUNBRITE Yellow 74 (Sun Chemical); SPECTRA PAC C Orange 16 (Sun Chemical); HELIOGEN Blue K6902, K6910 (BASF); SUNFAST® Magenta 122 (Sun Chemical); HELIOGEN Blue D6840, D7080 (BASF); Sudan Blue OS (BASF); NEOPEN Blue FF4012 (BASF); PV Fast Blue B2GO1 (Clariant); IRGALITE Blue BCA (Ciba); PALIOGEN Blue 6470 (BASF); Sudan Orange G (Aldrich), Sudan Orange 220 (BASF); PALIOGEN Orange 3040 (BASF); PALIOGEN Yellow 152, 1560 (BASF); LITHOL Fast Yellow 0991 K (BASF); PALIOTOL Yellow 1840 (BASF); NOVOPERM Yellow FGL (Clariant); Lumogen Yellow D0790 (BASF); Suco-Yellow L1250 (BASF); Suco-Yellow D1355 (BASF); Suco Fast Yellow D1355, D1351 (BASF); HOSTAPERM Pink E 02 (Clariant); Hansa Brilliant Yellow 5GX03 (Clariant); Permanent Yellow GRL 02 (Clariant); Permanent Rubine L6B 05 (Clariant); FANAL Pink D4830 (BASF); CINQUASIA Magenta (DU PONT); PALIOGEN Black L0084 (BASF); Pigment Black K801 (BASF); and carbon blacks such as REGAL 330™ (Cabot), Carbon Black 5250, Carbon Black 5750 (Columbia Chemical), and the like, as well as mixtures thereof.

In an exemplary embodiment, a digital offset ink composition may include a cyan pigment, CIBA IRGALITE Blue GOL, originally available from BASF HELIOGEN Blue D 7088. The amount of colorant or pigment added to the ink composition may be within the range of from about 10% to about 30% by weight of the composition, or from about 19% to about 25%, or from about 20% or more, up to about 30%, based on the total weight of the ink composition.

The colorant may be added together with a clay (d) component. In an embodiment, the clay is CLAYTONE® HY from Southern Clay Products. In another embodiment, the clay component is replaced with a silica, e.g.: AEROSIL 200 available from Degussa Canada Ltd, and is added in an amount within the range of from about 1% to about 5% by weight, or from about 1.4% to about 3.5% by weight, or from about 1.8% to 2.0% by weight, based on the total weight of the composition.

Digital offset ink compositions of embodiments include initiator systems (e), which may include a photoinitiator that initiates polymerization of curable components of the ink, including the curable monomer. In an embodiment, the initiator is an ultraviolet radiation-activated photoinitiator.

In another embodiment, the initiator is a radical initiator. Examples of suitable radical photoinitiators include, but are not limited to, ketones such as benzyl ketones, monomeric hydroxyl ketones, polymeric hydroxyl ketones, and alpha-amino ketones; acyl phosphine oxides, metallocenes, benzophenones, and benzophenone derivatives, such as 2,4,6-trimethylbenzophenone and 4-methylbenzophenone; and thioxanthenones, such as 2-isopropyl-9H-thioxanthen-9-one. A specific ketone is 1-[4-(2-hydroxyethoxy)-phenyl]-2-hydroxy-2-methyl-1-propane-1-o-ne. In a specific embodiment, the ink contains an alpha-amino ketone, 1-[4-(2-hydroxyethoxy)-phenyl]-2-hydroxy-2-methyl-1-propane-1-one.

In another embodiment, the curable ink composition comprises a three-component photoinitiator system with no synergist. U.S. Pat. No. 6,896,937 discloses a radiation-curable ink composition comprising a colorant, a polymerizable monomer and a photoinitiating system comprising 0.5 to 1.5% by weight of an aromatic ketone photoinitiator, 2 to 10% by weight of an amine synergist, 3 to 8% by weight of a second photoinitiator that is different than the aromatic ketone photoinitiator and capable of undergoing alpha cleavage, and 0.5 to 1.5% by weight of a photosensitizer. U.S. Pat. No. 6,896,937 also discloses liquid curable ink compositions and compositions with liquid diluents, which inks are not solids at room temperature. U.S. Pat. No. 7,322,688 discloses a method of printing curable inks in which the inks are polymerized by a cationic photoinitiating system. In embodiments, the curable ink composition comprises a photoinitiator that initiates polymerization of curable components of the ink, including the curable monomer.

In embodiments, the initiator is a radical initiator. Examples of suitable radical photoinitiators include, for example, ketones such as benzyl ketones, monomeric hydroxyl ketones, polymeric hydroxyl ketones, and α-amino ketones; acyl phosphine oxides, metallocenes, benzophenones and benzophenone derivatives, such as 2,4,6-trimethylbenzophenone and 4-methylbenzophenone; and thioxanthenones, such as 2-isopropyl-9H-thioxanthen-9-one. An exemplary ketone is 1-[4-(2-hydroxyethoxy)-phenyl]-2-hydroxy-2-methyl-1-propane-1-one. In an embodiment, the ink contains an .alpha.-amino ketone, 1-[4-(2-hydroxyethoxy)-phenyl]-2-hydroxy-2-methyl-1-propane-1-one and 2-isopropyl-9H-thioxanthen-9-one. In a specific embodiment, the photoinitiator comprises 2-isopropylthioxanthone and 2-isopropylthioxanthone, 2-methyl-1 [4-(methylthio) phenyl]-2-morpholinopropan-1-one, or a mixture or combination thereof.

In specific embodiments, the curable solid inks herein also include photoinitiators, such as α-hydroxyketone photoinitiators (including α-hydroxyketone photoinitiators sold under the trade name IRGACURE®184, IRGACURE® 500, DAROCUR® 1173, and IRGACURE® 2959, which are manufactured by BASF SE), α-aminoketone photoinitiators (including a-minoketone photoinitiators IRGACURE® 369, IRGACURE® 379, IRGACURE® 907, and IRGACURE® 1300, which are manufactured by BASF SE), and bisacyl phospine photoinitiators (including bisacyl phospine photoinitiators sold under the trade name IRGACURE® 819, IRGACURE® 819DW, and IRGACURE® 2022, which are manufactured by BASF SE). Other suitable photoinitiators include monoacylphosphine oxide and bisacylphosphine oxide, such as 2,4,6-trimethylbenzoybiphenyl-phosphine oxide (manufactured by BASF under the trade name Lucirin® TPO); ethyl-2,4,6-trimethylbenzoylphenyl phosphinate (manufactured by BASF SE under the tradename Lucirin® TPO-L); mono- and bis-acylphosphine photoinitiators (such IRGACURE® 1700, IRGACURE® 1800, IRGACURE® 1850, and DAROCUR® 4265, manufactured by BASF SE), and benzyldimethyl-ketal photoinitiators (such as IRGACURE® 651, manufactured by BASF SE).

The initiator system may be a combination of one or more of the above-mentioned initiators, such as a combination of IRGACURE® 184 and IRGACURE® 819. The total amount of initiator can be added in an amount of from about 4% to about 10% by weight or from about 5% to about 7% by weight, or from about 5.25 to about 6.25% by weight, based on the total weight of the composition.

Additional curable components (f) may include compounds such as multifunctional acrylate and methacrylate monomers and oligomers that can be included as reactive diluents and as materials that can increase the crosslink density of the cured image, thereby enhancing the toughness of the cured images. Examples of suitable multifunctional acrylate and methacrylate monomers and oligomers include (but are not limited to) pentaerythritol tetraacrylate, pentaerythritol tetramethacrylate, 1,2-ethylene glycol diacrylate, 1,2-ethylene glycol dimethacrylate, 1,6-hexanediol diacrylate, 1,6-hexanediol dimethacrylate, 1,12-dodecanol diacrylate, 1,12-dodecanol dimethacrylate, tris(2-hydroxy ethyl) isocyanurate triacrylate, propoxylated neopentyl glycol diacrylate (available from Sartomer Co. Inc. as SR 9003), hexanediol diacrylate, tripropylene glycol diacrylate, dipropylene glycol diacrylate, amine modified polyether acrylates (available as PO 83 F, LR 8869, and/or LR 8889 (all available from BASF Corporation), trimethylolpropane triacrylate, glycerol propoxylate triacrylate, dipentaerythritol pentaacrylate, dipentaerythritol hexaacrylate, ethoxylated pentaerythritol tetraacrylate (available from Sartomer Co. Inc. as SR 494), and the like, as well as mixtures and combinations thereof.

The particular additional curable component monomer, oligomer, prepolymer, etc. is not critical to the embodiments. Other suitable monomers, such as mono-, di-, tri-, or higher-functional monomers. The curable ink compositions can further include conventional additives to take advantage of the known functionality associated with such conventional additives. Such additives may include, for example, defoamers, slip and leveling agents, plasticizers, pigment dispersants, viscosity modifiers, antioxidants, absorbers, etc.

The ink may contain further optional additives including, but not limited to, surfactants, (e.g., silicone surface additives such as BYK 3500), light stabilizers, UV absorbers, which absorb incident UV radiation and convert it to heat energy that is ultimately dissipated, antioxidants, optical brighteners, which can improve the appearance of the image and mask yellowing, thixotropic agents, dewetting agents, slip agents, foaming agents, antifoaming agents, flow agents, waxes, oils, plasticizers, binders, electrical conductive agents, organic and/or inorganic filler particles, leveling agents, e.g., agents that create or reduce different gloss levels, opacifiers, antistatic agents, dispersants, and the like. In particular, the composition may include, as a stabilizer, a radical scavenger, such as IRGASTAB® UV 10 (BASF SE). The composition may also include an inhibitor, preferably a hydroquinone, to stabilize the composition by prohibiting or, at least, delaying, polymerization of the oligomer and monomer components during storage, thus increasing the shelf life of the composition. However, additives may negatively affect cure rate, and thus care must be taken when formulating a composition using optional additives.

Optional additives (g) may be present in any suitable amount. In embodiments, the total amount of other additives added to the composition may be from about 0.1 to about 15% or from about 0.2 to about 10%, by weight based upon the total weight of the curable solid ink composition.

The method of making pigmented, curable, high viscosity liquid inks will be described with specific reference to the examples provided below. All parts and percentages are by weight unless otherwise indicated.

Water-dilutable inks were formed for ink-based digital printing. The following components were selected to demonstrate water-dilutable inks in accordance with embodiments. These components, however, do not limit the scope of the disclosure. An exemplary water-dilutable ink may include, for example, a cyan pigment, Ciba IRGALITE Blue GLO, originally from Ciba, now available from BASF Heliogen Blue D 7088 (old IRGALITE Blue GLO); curable functional water-dilutable acrylates monomers available from Cytec: EBECRYL® 2003, EBECRYL® 11, EBECRYL® 12; SOLSPERSE 39,000 dispersant available from Lubrizol, ADDITOL VXL 4951, a defoaming agent available from Cytec; a thermal stabilizer, IRGASTAB UV10 available from BASF; AEROSIL 200 vs available from Degussa Canada Ltd; and a photoinitiator system including IRGACURE 819, Bis(2,4,6-trimethylbenzoyl)-phenylphosphineoxide), IRGACURE 379, 2-Dimethylamino-2-(4-methyl-benzyl)-1-(4-morpholin-4-yl-phenyl)-butan-1-one, and ESACURE Kip 150, Oligo [2-hydroxy-2-methyl-1-[4-(1-methylvinyl)phenyl]propanone] respectively available from BASF, BASF, and Lamberti, respectively. Finally, 2 oligomers were selected from Sartomer: CN2255, a high viscosity polyester acrylate oligomer with a glass transition T of −13° C. and CN2256, also a polyester acrylate oligomer with viscosity of 11,000 cps at 60° C. and a glass transition T of −22° C.

Ink formulations based on the above-mentioned water-dilutable ink material components were formed. These inks were prepared by the process disclosed by Lee et al., in the 185 Application. Exemplary formulations are disclosed in Table 1, and do not limit the scope of disclosure.

TABLE 1

Water-Dilutable Ink Formulations

| Chemical | C26 wt % | C27 wt % | C35 wt % | C40 wt % |
|---|---|---|---|---|
| Ciba Irgalite Blue GOL | 20.00 | 20.00 | 15.00 | 15.00 |
| Sartomer CN2255 (high visco) | 32.00 | 10.00 | 0.00 | 0.00 |
| Sartomer CN2256 | 0.00 | 0.00 | 7.00 | 8.00 |
| Ebecryl 2003 | 24.30 | 37.90 | 41.00 | 37.50 |
| Ebecryl 11 | 5.00 | 7.80 | 9.93 | 8.30 |

TABLE 1-continued

Water-Dilutable Ink Formulations

| Chemical | C26 wt % | C27 wt % | C35 wt % | C40 wt % |
|---|---|---|---|---|
| Ebecryl 12 | 10.00 | 15.60 | 17.37 | 15.00 |
| Solsperse 39000 | 4.50 | 4.50 | 4.50 | 4.50 |
| Additol VXL 4951 | 2.00 | 2.00 | 2.00 | 2.00 |
| Irgacure 819 | 0.00 | 0.00 | 0.00 | 1.39 |
| Irgacure 379 | 0.00 | 0.00 | 0.00 | 2.00 |
| Kip 150 | 0.00 | 0.00 | 0.00 | 3.61 |
| Ciba Irgastab UV10 | 0.20 | 0.20 | 0.20 | 0.20 |
| Aerosil 200 | 2.00 | 2.00 | 3.00 | 2.50 |
| Total | 100.00 | 100.00 | 100.00 | 100.00 |
| Viscosity (5 1/s) | | 2.75E+05 | 1.93E+05 | 1.90E+05 |
| Viscosity (50 1/s) | No data at 25 C. (too high) | 3.09E+04 | 7.65E+03 | 7.05E+03 |
| Shear Thinning Index* (50/5 1/s) | | 0.112 | 0.040 | 0.037 |

*Shear Thinning Index = Ratio of viscosity at 50 1/s to viscosity at 5 1/s.

Rheology data was obtained on all ink included in Table 1. The shear viscosities of samples were measured using an Ares G2 controlled-strain rheometer having 25 mm parallel plate geometry, set at 0.5 mm gap and 25° C. such that the applied shear rate sweep ranged from 0.0001 to 500 s$^{-1}$. An ARES G2 controlled strain rheometer with a PELTIER temperature control (25MN, 0.02 RAD cone plate) for rapid heating and cooling was used for obtaining the rheology data. A flow sweep test procedure was run at 25° C., at a shear rate of 1.0E+−04 to 500 1/sec.

The printing performance of the radiation curable ink composition labeled as C35 in Table 1 was evaluated on an ink-based digital printing system. A transfer efficiency of the ink was measured to find an efficiency of about 90% using a fluorosilicone imaging plate wherein 0.084 mg/cm$^2$ of ink was used or a film of about 0.7 microns in thickness was formed. In a separate study, it was found that the transfer efficiency of a water-dilutable ink in accordance with the C35 formulation was dependent both on the film thickness and on the shear thinning characteristics of the inks. A thinner film was found to result in higher transfer efficiency. The C40 formulation, for example, has similar rheological properties, and therefore is expected to provide similar transfer efficiency.

Water-dilutable inks in accordance with embodiments are suitable for ink-based digital printing systems and can be easily cleaned from system components using a water-based solution thereby reducing cleaning costs and waste. Water-dilutable inks are compatible with digital offset printing system components; they are minimally soluble, or preferably immiscible in dampening fluid, particularly D4, and do not swell, for example, a fluorsilicone-containing surface of an imaging plate. Also, water-dilutable inks in accordance with embodiments provide desirable transfer efficiency including a transfer efficiency of 90% or higher up to greater than 99% for optimized inks, which is significantly higher than the typical 50% transfer efficiency observed when using related art offset inks.

Water-diluted inks are also provided. Water-diluted acrylate inks suitable for ink-based digital printing were formed using the following component. A cyan pigment, Ciba Irgalite Blue GLO, originally from Ciba, now available from BASF HELIOGEN® Blue D 7088 (old IRGALITE® Blue GLO); curable functional water-dilutable acrylates monomers available from Cytec: EBECRYL® 2003; EBECRYL® 11; Ebecryl®12; SOLSPERSE® 39000 dispersant available from Lubrizol, ADDITOL® VXL 4951, or SILSURF® 004-AC-UP, a defoaming agent available from Cytec and Siltech, respectively; a thermal stabilizer, Irgastab UV10 available from BASF SE; AEROSIL® 200 vs available from Degussa Canada Ltd; and a photoinitiator system composed of Irgacure 819, Bis(2,4,6-trimethylbenzoyl)-phenylphosphineoxide); Irgacure 379, 2-Dimethylamino-2-(4-methyl-benzyl)-1-(4-morpholin-4-yl-phenyl)-butan-1-one, and Esacure Kip 150, Oligo [2-hydroxy-2-methyl-1-[4-(1-methylvinyl)phenyl]propanone], respectively available from BASF SE, BASF SE, and Lamberti S.p.A. Finally, 2 oligomers were selected from Sartomer USA, LLC, CN2255, a high viscosity polyester acrylate oligomer with a glass transition T of −13° C. and CN2256 also a polyester acrylate oligomer with viscosity of 11,000 cps at 60 degrees C. and a glass transition T of −22° C. Using these components, water-dilutable inks were prepared as discussed above. A number of radiation curable ink concentrates and inks were formulated for comparing water-diluted acrylate inks. Of these, two formulations were selected for water dilution in accordance with embodiments, based on high pigment loading, and high maximum viscosity values. These inks are shown in Table 2.

TABLE 2

Ink Formulations and Viscosities Prior to Water Dilution

| Chemical | Ink C73 | Ink C74 |
|---|---|---|
| Ciba Irgalite Blue GLO | 12.00 | 18.00 |
| Sartomer CN2256 | 8.72 | 8.23 |
| Ebecryl® 2003 | 40.00 | 37.75 |
| Ebecryl® 11 | 10.74 | 9.65 |
| Ebecryl® 12 | 19.34 | 17.37 |
| Solsperse® 39000 | 3.60 | 5.40 |
| Silsurf® 004-AC-UP | 0.40 | 0.40 |
| Irgastab UV10 | 0.20 | 0.20 |
| Aerosil® 200 | 5.00 | 3.00 |
| Total | 100.00 | 100.00 |
| Viscosity (25 C.) in cps (model, infinite shear) | | |
| Maximum Viscosity, mPa · s | 4.05E+09 | 2.61E+08 |
| Viscosity (5 1/s), mPa · s | 881592 | 295258 |
| Viscosity (50 1/s), mPa · s | 108731 | 5594 |
| Shear Thinning Index (50 1/s/5 1/s) | 0.12 | 0.02 |

The inks were diluted with 5% deionized water. Diluted inks were prepared by vigorously stirring water into ink, then allowing ink to set over three days prior to rheological analysis. Ink was characterized to determine rheology using the same techniques discussed above with a respect to water-dilutable inks. For example, the shear viscosities of samples were measured using an Ares G2 controlled-strain rheometer having 25 mm parallel plate geometry, set at 0.5 mm gap and 25° C. such that the applied shear rate sweep ranged from 0.0001 to 500 s$^{-1}$. An ARES G2 controlled strain rheometer with a PELTIER temperature control (25MN, 0.02 RAD cone plate) for rapid heating and cooling was used for obtaining the rheology data. The water-diluted ink rheology is shown in Table 3.

TABLE 3

| Viscosity (25 C.) in cps (model, infinite shear) | Water-Diluted Ink Rheology | |
|---|---|---|
| | Ink | |
| | C73 + 5% Water | C74 + 5% Water |
| Maximum Viscosity, mPa · s | 1.12E+06 | 7.66E+05 |
| Viscosity (5 1/s), mPa · s | 117622 | 60418 |
| Viscosity (50 1/s), mPa · s | 14781 | 8879 |
| Shear Thinning Index (501/s/5 1/s) | 0.13 | 0.15 |

A printing performance of the polar ink design of water-diluted inks in accordance with embodiments was evaluated using a variable data lithographic printing system like the system shown in FIG. 1. The transfer efficiency was measured at about 90% using a fluorosilicone plate on which 0.084 mg/cm$^2$ of ink was applied to form a film of about 0.7 microns in thickness. Desirable transfer efficiency of about 90% and suitable background performance were obtained for the polar acrylate ink design. Water-diluted inks having reduced rheology, provide desirable transfer efficiency, anilox roll delivery performance, and uniform area coverage.

Rheology measurements demonstrated that an ink formulation comprising C73 and 5% water has rheology of at least two orders of magnitude lower than that of the base ink C73, as well as a high shear thinning index. The inks are expected to flow more efficiently from the anilox roll in the rheology and shear thinning range of water-diluted inks of embodiments. Further, while transfer efficiency was observed to be poor for the water-diluted ink at a start of water evaporation, as expected with a lower viscosity ink, the transfer efficiency was found to be about 90% upon water evaporation from the ink.

With the assistance of water evaporation subsystems in the variable data lithography systems used from printing with digital offset inks of embodiments, high transfer efficiencies may be obtained with water diluted acrylate inks at lower cost than conventional inks. For example, in accordance with a water-dilutable ink-based digital printing system of an embodiment, the ink-based digital printing system as shown in FIG. 1 may further include a water evaporation subsystem (not shown in FIG. 1) for evaporating water from the ink when the ink is disposed on the imaging member surface after ink delivery. The evaporation system may be configured and arranged for evaporating water from water-diluted ink in accordance with an embodiment of water-dilutable ink that has been diluted with 1-10% water to form a water-diluted ink in accordance with embodiment. For example, water-diluted polar acrylate ink may be delivered, as diluted, to a fluorosilicone-containing surface layer of an imaging member while the ink has a low viscosity. The evaporation subsystem may be configured to apply heat to the ink on the imaging member surface layer to evaporate water from the ink after delivery, thereby advantageously increasing a viscosity of the ink while on the surface layer of the imaging member to accommodate high quality, high speed variable data lithographic printing.

Water-dilutable and water-diluted inks in accordance with embodiments save costs compared to fully curable inks or non-aqueous offset inks, including lower packaging costs. The provided inks can be diluted on-site by customers, and dried prior to substrate contact to minimize or eliminate image quality defects associated with conventional aqueous ink printing, and reduce energy need for water evaporation compared to conventional water-based inks. Inks of embodiments are immiscible with D4 dampening fluid, yielding low background. They exhibit high transfer efficiency from fluorosilicone plates with water evaporation, and are suitable for ink delivery by way of anilox roll-based ink delivery systems, thereby and lower ink delivery costs overall. Moreover, a rheology of provided inks may be adjusted and selected for optimized anilox roll delivery.

It will be appreciated that the above-disclosed and other features and functions, or alternatives thereof, may be desirably combined into many other different compositions or formulations, systems or applications. Also, various presently unforeseen or unanticipated alternatives, modifications, variations or improvements therein may be subsequently made by those skilled in the art.

What is claimed is:

1. An ink composition for variable data lithographic printing, comprising:
    a water-dilutable ink and a diluent consisting of water, wherein said water-dilutable ink has a viscosity of from about 1×10$^4$ to about 1×10$^7$ centipoise at 25° C. and a shear rate of from about 1 to about 500 sec$^{-1}$ and wherein the diluent is in an amount of from about 0.01 to about 5% by weight,
    wherein the water-dilutable ink comprises a radiation-curable water-dilutable compound, and a colorant,
    wherein a viscosity of the ink composition for variable data lithographic printing at 5 sec$^{-1}$ after adding the diluent to the water-dilutable ink is from about 1.05 to about 15 times lower than the viscosity of the water-dilutable ink before adding the diluent.

2. The ink composition of claim 1, wherein the radiation-curable water-dilutable compound comprises water-dilutable monomer compounds selected from the group of compounds comprising mono-, di-, and tri-functional water-dilutable acrylate monomers and oligomers.

3. The ink composition of claim 2, wherein the radiation-curable water-dilutable compound comprises functional acrylate compounds.

4. The ink composition of claim 2, wherein the radiation-curable water-dilutable monomer compounds are multi-functional acrylate compounds.

5. The ink composition of claim 2, wherein the radiation-curable water-dilutable compound is an aromatic urethane acrylate.

6. The ink composition of claim 2, wherein the radiation-curable water-dilutable compound is polyethylene glycol diacrylate.

7. The ink composition of claim 2, wherein the radiation-curable water-dilutable compound is polyether triacrylate.

8. The ink composition of claim 2, wherein the radiation-curable water-dilutable compound is present in an amount of from about 1% to about 85% by weight.

9. The ink composition of claim 2, wherein the radiation-curable water-dilutable compound is present in an amount of from about 30% to about 80% by weight.

10. The ink composition of claim 2, wherein the radiation-curable water-dilutable compound is present in an amount of from about 50% to about 70% by weight.

11. The ink composition of claim 1, wherein the colorant comprises a pigment, the pigment being present in an amount ranging from about 10% to about 30% by weight.

12. The ink composition of claim 1, wherein the colorant comprises a pigment, the pigment being present in an amount ranging from about 15% to about 30% by weight.

13. The ink composition of claim 1, wherein the colorant comprises a pigment, the pigment being present in an amount ranging from about 20% to about 25% by weight.

14. An ink composition for variable data lithographic printing, comprising:
- a water-dilutable ink and a diluent consisting of water, wherein said water-dilutable ink has a viscosity of from about $1\times10^4$ to about $1\times10^7$ centipoise at 25° C. and a shear rate of from about 1 to about 500 sec$^{-1}$ and wherein the diluent is in an amount of from about 0.01 to about 10% by weight,
- wherein the water-dilutable ink comprises a radiation-curable water-dilutable compound, and a colorant,
- wherein a viscosity of the ink composition for variable data lithographic printing at 5 sec$^{-1}$ after adding the diluent to the water-dilutable ink is from about 1.05 to about 15 times lower than the viscosity of the water-dilutable ink before adding the diluent.

15. The ink composition of claim 14, wherein the radiation-curable water-dilutable compound comprises a water-dilutable monomer compounds selected from the group of compounds comprising mono-, di-, and tri-functional water-dilutable acrylate monomers and oligomers.

16. The ink composition of claim 14, wherein the colorant component is a pigment, the pigment being present in an amount of from about 10% to about 30% by weight.

17. A method of using an ink composition for variable data lithographic printing, comprising:
- applying a dampening fluid to an imaging member surface;
- forming a latent image by evaporating the dampening fluid from selected locations on the imaging member surface to form hydrophobic non-image areas and hydrophilic image areas;
- developing the latent image by applying an amount of the ink composition to the hydrophilic image areas, the ink composition comprising a water-dilutable ink and a diluent consisting of water, wherein said water-dilutable ink has a viscosity of from about $1\times10^4$ to about $1\times10^7$ centipoise at 25° C. and a shear rate of from about 1 to about 500 sec$^{-1}$ and wherein the diluent is in an amount of from about 0.01 to about 5% by weight,
- wherein the water-dilutable ink comprises a radiation-curable water-dilutable compound, and a colorant,
- wherein a viscosity of the ink composition for variable data lithographic printing at 5 sec$^{-1}$ after adding the diluent to the water-dilutable ink is from about 1.05 to about 15 times lower than the viscosity of the water-dilutable ink before adding the diluent;
- transferring the developed latent image to a receiving substrate.

18. The method of claim 17, wherein the transferring further comprises:
- removing at least 90% of the amount of the applied ink composition from the imaging member surface.

19. The method of claim 17, wherein the method further comprises:
- drying the ink on the imaging member surface.

20. The method of claim 17, wherein forming the latent image further comprises: exposing the selected locations on the imaging member surface to UV radiation, wherein the exposed selected locations are selected from digital image data.

21. The method of claim 17, wherein the dampening fluid comprises D4 or D5 or mixtures thereof.

22. The method of claim 17, wherein the radiation-curable water-dilutable compound is present in an amount of from about 1% to about 85% by weight.

* * * * *